United States Patent
Yeh et al.

Patent Number: 6,165,857
Date of Patent: Dec. 26, 2000

[54] METHOD FOR FORMING A TRANSISTOR WITH SELECTIVE EPITAXIAL GROWTH FILM

[75] Inventors: Wen-Kuan Yeh, Chu-Pei; Tony Lin; Jih-Wen Chou, both of Hsin-Chu, all of Taiwan

[73] Assignee: United Micoelectronics Corp., Hsin-Chu, Taiwan

[21] Appl. No.: 09/469,008

[22] Filed: Dec. 21, 1999

[51] Int. Cl.⁷ .................................................. H01L 21/336
[52] U.S. Cl. ........................................ 438/303; 438/305
[58] Field of Search ................................... 438/682, 279, 438/303, 300, 299, 306, 305, 481, 307, 482

[56] References Cited

U.S. PATENT DOCUMENTS

| | | | |
|---|---|---|---|
| 5,652,156 | 7/1997 | Liao et al. | 438/682 |
| 5,882,973 | 3/1999 | Gardner et al. | 438/279 |
| 6,015,753 | 1/2000 | Lin et al. | 438/682 |

*Primary Examiner*—David Nelms
*Assistant Examiner*—Dung A. Le
*Attorney, Agent, or Firm*—Harness, Dickey & Pierce, P.L.C.

[57] ABSTRACT

A new improvement for selective epitaxial growth is disclosed. In one embodiment, the present invention provides a low power metal oxide semiconductor field effect transistor (MOSFET), which includes a substrate. Next, a gate oxide layer is formed on the substrate. Moreover, a polysilicon layer is deposited on the gate oxide layer. Patterning to etch the polysilicon layer and the gate oxide layer to define a gate. First ions are implanted into the substrate by using said gate as a hard mask. Sequentially, a liner oxide is covered over the entire exposed surface of the resulting structure. Moreover, a conformal first dielectric layer and second dielectric layer are deposited above the liner oxide in proper order. The second dielectric layer is etched back to form a dielectric spacer on sidewall of the first dielectric layer. Next, the first dielectric layer is etched until upper surface of the gate and a portion of the substrate are exposed, wherein a part of the second dielectric layer is also etched accompanying with etching a part of the first dielectric layer. Further, second ions are implanted into the exposed substrate to form a source/drain region. A conductive layer is selectively formed on said over the exposed gate and source/drain. Finally, a self-aligned silicide layer is formed over the conductive layer.

23 Claims, 3 Drawing Sheets

METHOD FOR FORMING A TRANSISTOR WITH SELECTIVE EPITAXIAL GROWTH FILM

BACKGROUND OF THE INVENTION

1. Field of the Invention

The present invention relates to a metal oxide semiconductor field effect transistor (MOSFET), and more particularly, to a MOSFET with new improvement for selective epitaxial growth (SEG) technology.

2. Description of the Prior Art

Recently, demand for semiconductor devices has rapidly increased owing to widespread use of integrated electronic circuit. In particularly, metal oxide semiconductor field effect transistor (MOSFET) has become a basic and elementary component used in integrated circuits (ICs), such as semiconductor memory deices. More particularly, as more than hundreds or thousands of electrical components are integrated into the ICs, a means for new improvement for selective epitaxial growth (SEG) technology in smaller dimension of the MOSFET becomes imperative.

For sub-0.13 μm device, ultra shallow source/drain extension must be controlled to less than 50 nm. By the way, deep source/drain junction depth will be also scaled down to less than 150 nm; thus, cobalt Co salicidation process is very difficult to employed with enough process margin to maintain good junction integrity. In order to solve these problems, selective epitaxial growth (SEG) film is necessary to improve the process margin of cobalt Co salicidation on sub-0.13 μm device. But the selectivity of selective epitaxial (SEG) is very critical to push the SEG technology to production line.

For the foregoing reasons, there is a need for a MOSFET with new improvement for SEG technology.

SUMMARY OF THE INVENTION

In accordance with the present invention, a metal oxide semiconductor field effect transistor (MOSFET) is provided for new improvement for selective epitaxial growth (SEG). Primarily, the purpose of the present invention provides means for manufacturing a MOSFET with the lengthened distance between gate to source/drain region, so that the bridging phenomena can be suppress.

Another purpose of the present invention is to provide that any selective epitaxial growth (SEG) film selectivity loss (selective epitaxial growth (SEG) island on spacer) still happen on the surface of oxide spacer, the oxide spacer can be removed to eliminate the selective epitaxial growth (SEG) island.

A further purpose of the present invention is to provide a MOSFET; selective epitaxial growth (SEG) can be used to compatible with Co salicidation process on sub-0.15 μm technology without selectivity issue of selective epitaxial growth (SEG) technology.

In one embodiment, the present invention provides a low power metal oxide semiconductor field effect transistor (MOSFET), which includes a substrate. Next, a gate oxide layer is formed on the substrate. Moreover, a polysilicon layer is deposited on the gate oxide layer. Patterning to etch the polysilicon layer and the gate oxide layer to define a gate. First ions are implanted into the substrate by using said gate as a hard mask. Sequentially, a liner oxide is covered over the entire exposed surface of the resulting structure. Moreover, a conformal first dielectric layer and second dielectric layer are deposited above the liner oxide in proper order. The second dielectric layer is etched back to form a dielectric spacer on sidewall of the first dielectric layer. Next, the first dielectric layer is etched until upper surface of the gate and a portion of the substrate are exposed, wherein a part of the second dielectric layer is also etched accompanying with etching a part of the first dielectric layer. Further, second ions are implanted into the exposed substrate to form a source/drain region. A conductive layer is selectively formed on said over the exposited gate and source/drain. Finally, a self-aligned silicide layer is formed over the conductive layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
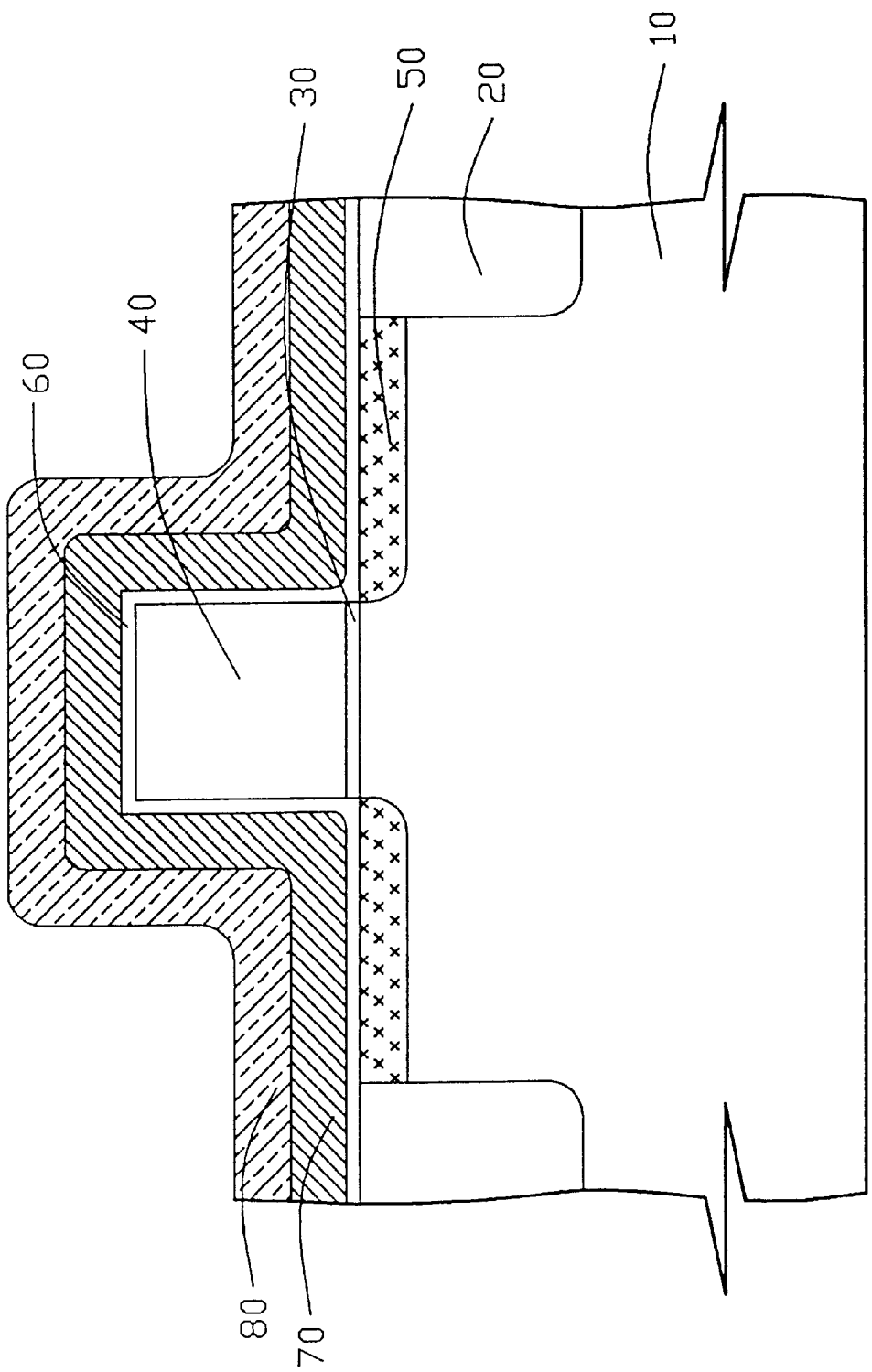
FIGS. 1 to 3 show cross-sectional views illustrative of various stages in the fabrication of a MOSFET in accordance with one embodiment of the present invention.
Figure 2:
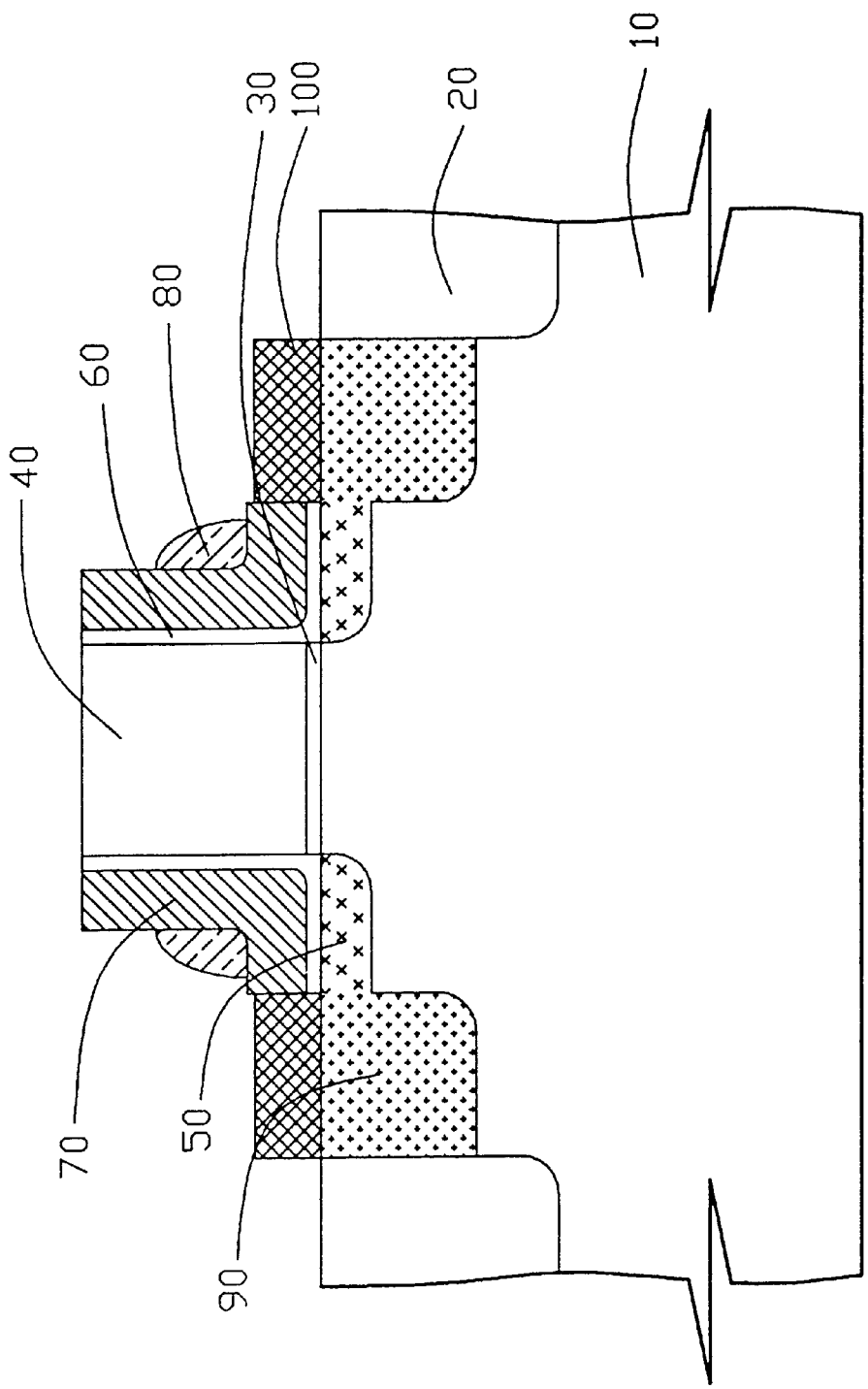
Figure 3:
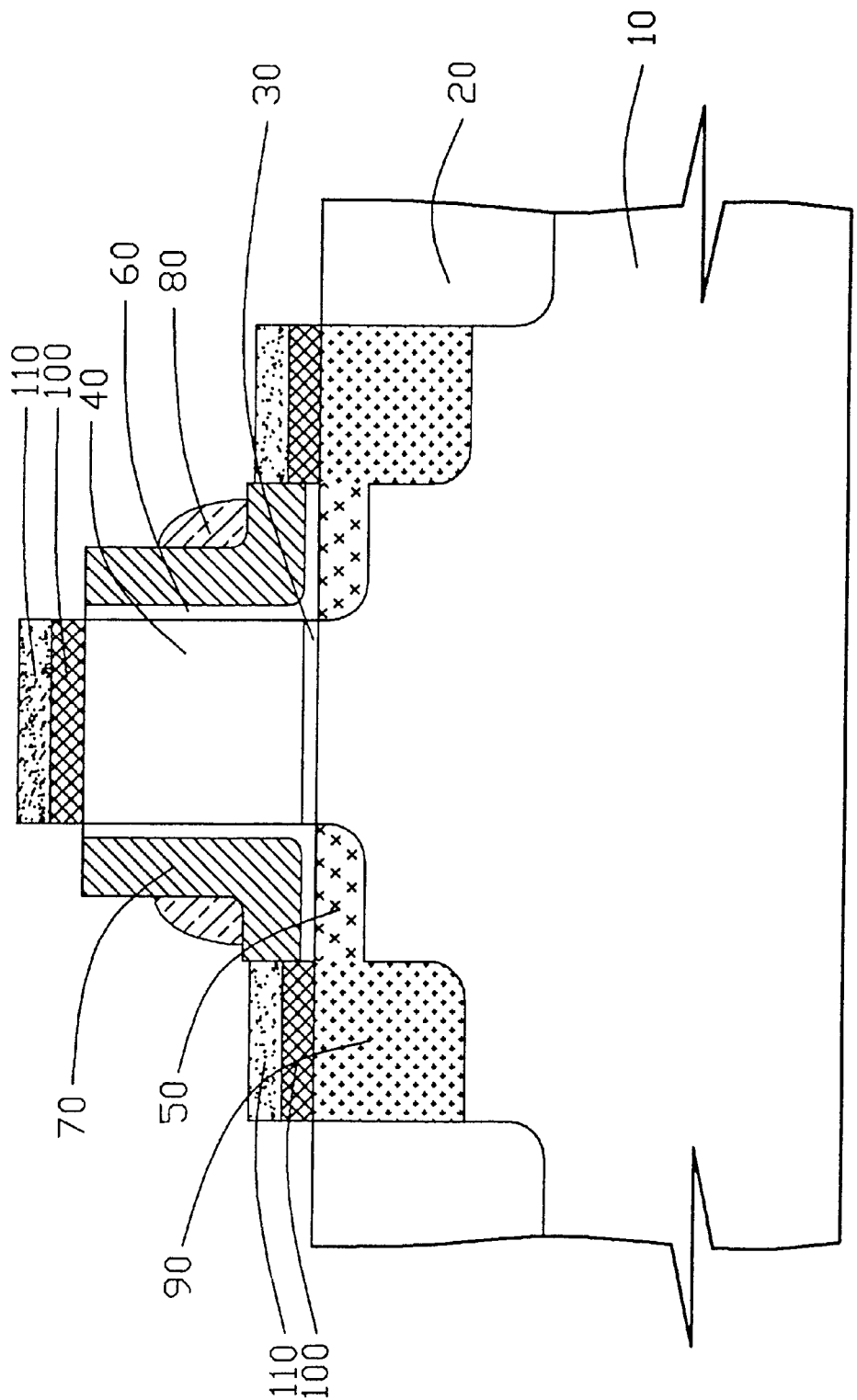

Referring to FIGS. 1–3, the process flow of a preferred embodiment according to the present invention is depicted in cross-sectional views. These drawings merely show several key steps in sequential processes.

Referring to FIG. 1, a silicon substrate 10 with p type conductivity is firstly provided wherein the silicon substrate 10. It is appreciated that a semiconductor substrate with n type conductivity can also be used. However, it is appreciated that an n-type semiconductor substrate can be adapted. And two shallow trench isolation (STI) regions 20, which are usually composed of silicon oxide, are formed in silicon substrate 10 by a traditional technique 20. The silicon substrate 10 is then placed into a furnace, and is subjected to a thermal oxidation, such as a dry oxidation process, thus forming a gate oxide layer 30 containing silicon oxide to a thickness of about 100–250 angstroms. Next, a standard low-pressure chemical vapor deposition (LPCVD) is applied to form a polysilicon layer 40 having a thickness of about 1000–3000 angstroms on the gate oxide layer 30. Generally, Arsenic or Phosphorus atoms are implanted or diffused into the polysilicon layer 40 to reduce its resistivity. Using conventional photolithography techniques, a gate electrode structure is formed above silicon substrate 10 by anisotropically etched, for example, a conventional dry etch or reactive ion etch (RIE) technique. Next using the gate electrode as a doping mask, ions such as Arsenic with concentration of about $10^{13}/cm^2$ are implanted into the silicon substrate 10, generally followed by a thermal driving in and annealing in a temperature of about 900–1000° C., and is usually designated as N⁻. Two lightly doped regions 50 are thus formed. Moreover, a liner oxide 60 of about 100–300 angstroms abuts on the entire exposed surface of the resulting structure by traditional oxide technique. Moreover, a conformal silicon nitride layer 70 is deposited above the liner oxide by using chemical vapor deposition (CVD), and then the thickness of the conformal silicon nitride layer is smaller than 1000 angstroms. Next, a conformal oxide layer 70 is deposited above the conformal silicon nitride layer. The conformal oxide layer 80 comprises silicon dioxide ($SiO_2$) or silicon oxynitride (SiON).

In the structure of FIG. 2, the oxide layer 80 is anisotropically etched back to form an oxide spacer on sidewall of the silicon nitride layer. Next, the nitride layer 70 is etched until upper surface of the gate electrode 40 and a portion of the silicon substrate 10 is exposed, wherein a part of the oxide spacer 80 is also etched accompanying with etching a part of the nitride layer 70 by anisotropically etched. Using the gate electrode 40 and silicon nitride 70 as a doping mask, N type ions such as Phosphorus or Arsenic with concentration of about $10^{15}/cm^2$ are implanted into the substrate 10, generally followed by a thermal driving in a temperature of about 900–1000° C., and is usually designated as $N^+$. Two heavily doped regions 90 are in the substrate 10. It is noted that the concentration of the heavily doped regions 90 is higher than the concentration of the lightly doped region 50 mentioned above. Next, a selective epitaxial growth (SEG) film 100 is selectively formed on the over the exposed gate electrode and source/drain. With this oxide spacer, so the selectivity of selective epitaxial growth (SEG) with about 500 angstroms on oxide spacer is better than on nitride spacer. If any selective epitaxial growth (SEG) film selectivity loss (selective epitaxial growth (SEG) island on spacer) still happened on the surface of oxide spacer, the oxide spacer can be removed to eliminate the selective epitaxial growth (SEG) island.

Finally, referring to the FIG. 3, this silicidation 110 is performed by a traditional process such as self-aligned silicidation (or salicide), which generally includes firstly blanket sputtering a metal Titanium (Ti) or Cobalt (Co) layer over the exposed the resulting structure in a high temperature. It makes the metal layer reacts with the underlying selective epitaxial growth (SEG) 100, thereby simultaneously depositing a self-aligned silicide layer over the exposed selective epitaxial growth (SEG) film 100. Those regions not reacted with the metal layer are then removed by, for example, a conventional wet etch. With this device structure, selective epitaxial growth (SEG) can be used to compatible with Co salicidation process on sub-0.15 $\mu$m technology without selectivity issue of selective epitaxial growth (SEG) technology. According to the aforementioned process of the present invention if any selective epitaxial growth (SEG) film selectivity loss (selective epitaxial growth (SEG) island on spacer) still happened on the surface of oxide spacer, the oxide spacer can be removed to eliminate the selective epitaxial growth (SEG) island. So the distance between gate electrode to source/drain region can lengthen, the bridging phenomenon can be suppressed.

Although specific embodiments have been illustrated and described, it will be obvious to those skilled in the art that various modifications may be made without departing from what is intended to be limited solely by the appended claims.

What is claimed is:

1. A method for forming a semiconductor device, said method comprising:

providing a semiconductor substrate;

forming a gate oxide layer on said semiconductor substrate;

depositing a polysilicon layer on said gate oxide layer;

patterning to etch said polysilicon layer and said gate oxide layer to from a gate;

implanting first ions into the semiconductor substrate by using said gate as a hard mask;

covering a linear oxide over the gate and the substrate;

depositing a conformal first dielectric layer and a conformal second layer above said liner oxide in proper order, wherein said second dielectric layer comprises silicon oxynitride (SiON);

etching back said second dielectric layer to form a dielectric spacer on sidewall of said first dielectric layer;

etching said first dielectric layer until upper surface of said gate and a portion of said semiconductor substrate is exposed, wherein a part of said second dielectric layer is also etched accompanying with etching a part of said first dielectric layer;

implanting second ions into said exposed semiconductor substrate to form a source/drain region;

selectively forming a conductive layer on said over the gate and source/drain; and forming a self-aligned silicide layer over said conductive layer.

2. The method according to claim 1, wherein said liner oxide layer comprises silicon dioxide.

3. The method according to claim 1, wherein said first dielectric layer comprises silicon nitride.

4. The method according to claim 1, wherein the thickness of said first dielectric layer is smaller than 1000 angstrom.

5. The method according to claim 1, wherein said second dielectric layer comprises silicon dioxide ($SiO_2$).

6. The method according to claim 1, wherein said conductive layer comprises a selective epitaxial growth (SEG) film.

7. The method according to claim 6, wherein said selective epitaxial growth (SEG) film comprises silicon.

8. The method according to claim 1, wherein the thickness of said conductive layer is about 500 angstrom.

9. The method according to claim 1, wherein said self-aligned silicide layer comprises Titanium silicide.

10. The method according to claim 1, wherein said self-aligned silicide layer region comprises Cobalt silicide.

11. The method according to claim 1, wherein said dielectric spacer on sidewall of said first dielectric layer is formed by an anisotropy etch method.

12. The method according to claim 1, wherein etching said first dielectric layer upper surface of said gate and a portion of said substrate is etched by an anisotropy etch method.

13. A method for forming a semiconductor device, said method comprising:

providing a silicon substrate;

forming a gate oxide layer on said silicon substrate;

depositing a polysilicon layer on said gate oxide layer;

patterning to etch said polysilicon layer and said gate oxide layer to form a gate;

implanting $N^-$-type ions into the silicon substrate by using said gate as a hard mask;

covering a liner oxide over the gate and the substrate;

depositing a conformal silicon nitride layer and a conformal oxide layer above said liner oxide in proper order;

anisotropically etching back said oxide layer to form a oxide spacer on sidewall of said silicon nitride layer, wherein said oxide spacer comprises silicon oxynitride (SiON);

anisotropically etching said silicon nitride layer until upper surface of said gate and a portion of said silicon substrate is exposed, wherein a part of said oxide layer is also etched accompanying with etching a part of said silicon nitride layer;

implanting $N^+$-type ions into said exposed silicon substrate to form a source/drain region, wherein said $N^+$-type ions having dosage greater than said $N^-$-type ions;

selectively forming a selective epitaxial growth (SEG) film on said over the gate and source/drain; and forming a self-aligned silicide layer over said selective epitaxial growth (SEG) film.

14. The method according to claim 13, wherein said gate is doped with ions P or As.

15. The method according to claim 13, wherein said liner oxide layer comprises silicon dioxide.

16. The method according to claim 13, wherein the thickness of said silicon nitride layer is smaller than 1000 angstrom.

17. The method according to claim 13, wherein said oxide spacer comprises silicon dioxide ($SiO_2$).

18. The method according to claim 13, wherein said selective epitaxial growth (SEG) film comprises silicon.

19. The method according to claim 13, wherein the thickness of said selective epitaxial growth (SEG) film is about 500 angstrom.

20. The method according to claim 13, wherein said oxide spacer on sidewall of said silicon nitride layer is formed by an anisotropy etch method.

21. The method according to claim 13, wherein etching said silicon nitride layer until upper surface of said gate and a portion of said silicon substrate is etched by an anisotropy etch method.

22. The method according to claim 13, wherein said self-aligned silicide layer comprises Titanium silicide.

23. The method according to claim 13, wherein said self-aligned silicide layer region further comprises Cobalt silicide.

* * * * *